US012646540B2

(12) United States Patent
Kang et al.

(10) Patent No.: US 12,646,540 B2
(45) Date of Patent: Jun. 2, 2026

(54) MEMORY DEVICE GENERATING VOLTAGE RESPONSIVE TO TEMPERATURE AND METHOD OF OPERATING THE SAME

(71) Applicant: SK hynix Inc., Icheon-si (KR)

(72) Inventors: Min Hye Kang, Icheon-si (KR); Chang Won Yang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 172 days.

(21) Appl. No.: 18/615,790

(22) Filed: Mar. 25, 2024

(65) Prior Publication Data

US 2025/0095696 A1    Mar. 20, 2025

(30) Foreign Application Priority Data

Sep. 14, 2023    (KR) ........................ 10-2023-0122538

(51) Int. Cl.
*G11C 7/04* (2006.01)
*G11C 7/10* (2006.01)
*G11C 16/30* (2006.01)

(52) U.S. Cl.
CPC .............. *G11C 7/04* (2013.01); *G11C 7/1012* (2013.01); *G11C 16/30* (2013.01)

(58) Field of Classification Search
CPC ........................................................ G11C 7/04
USPC ........................................................ 365/211
See application file for complete search history.

(56) References Cited

U.S. PATENT DOCUMENTS

2006/0202772 A1* 9/2006 Ishikawa ................ H03B 5/368
                                                          331/176
2012/0176082 A1* 7/2012 Lee .................... H01M 10/4264
                                                          903/907
2013/0314169 A1* 11/2013 Tokuhashi .............. H03L 1/023
                                                          331/176
2023/0402911 A1* 12/2023 Akatsuki ............... H02M 3/158

FOREIGN PATENT DOCUMENTS

KR        1020030091657 A       12/2003
KR        1020100049924 A        5/2010
KR        1020230015893 A        1/2023

* cited by examiner

*Primary Examiner* — Muna A Techane
(74) *Attorney, Agent, or Firm* — WILLIAM PARK AND ASSOCIATES LTD.

(57)        ABSTRACT

A memory device includes a memory cell array including a plurality of memory cells, a temperature sensor configured to measure an internal temperature and generate a temperature compensation code corresponding to the internal temperature, a voltage control circuit configured to generate a conversion temperature code converted from the temperature compensation code, and a voltage generation circuit configured to output a compensation voltage obtained by compensating for a level of a voltage used in an operation on the memory cell array responsive to the conversion temperature code. The temperature sensor and the voltage control circuit are may be located at different positions relative to the memory cell array.

20 Claims, 9 Drawing Sheets

Table of TC code

| Temperature | Temp code | TC group1 | TC group2 | TC group3 |
|:-----------:|:---------:|:---------:|:---------:|:---------:|
| ⋮ | ⋮ | ⋮ | ⋮ | ⋮ |
| 95°C ~ 100°C | 3 | 5 | 5 | 4 |
| 90°C ~ 95°C | 4 | 6 | 6 | 5 |
| 85°C ~ 90°C | 5 | 7 | 6 | 5 |
| 80°C ~ 85°C | 6 | 7 | 7 | 6 |
| ⋮ | ⋮ | ⋮ | ⋮ | ⋮ |

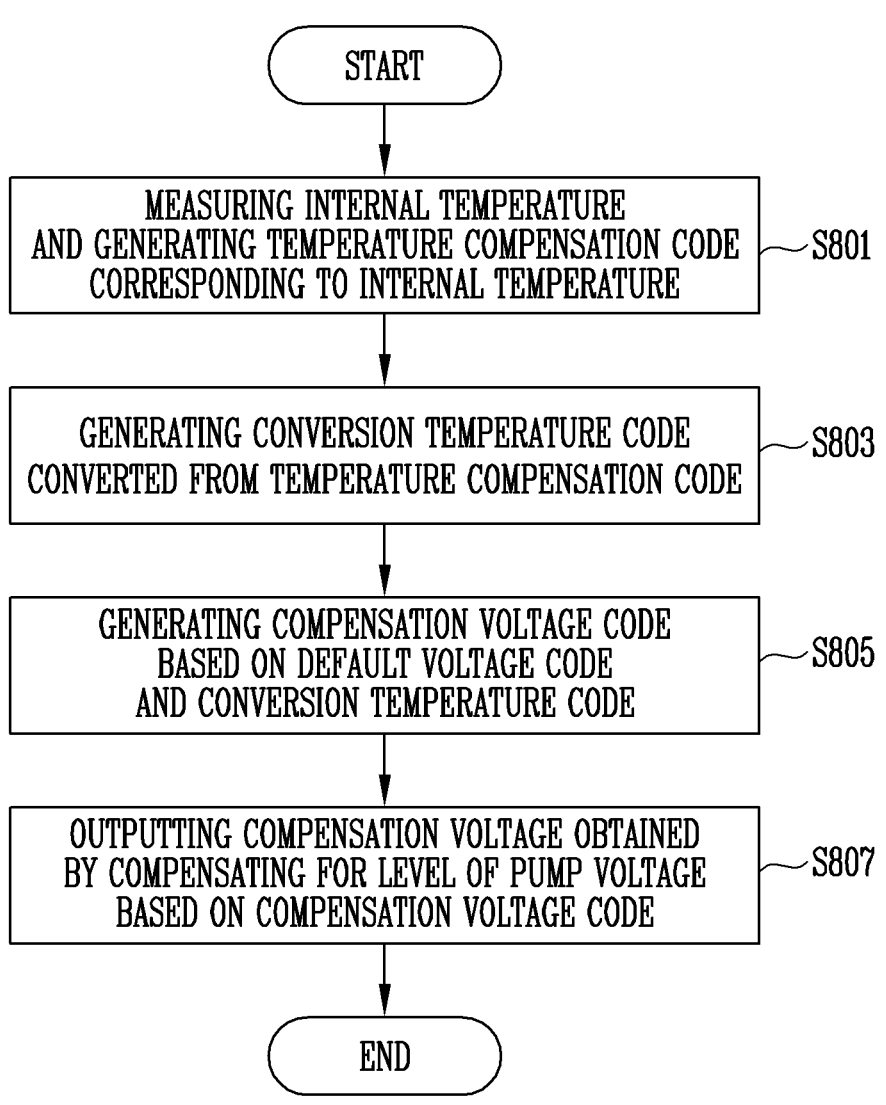

START

MEASURING INTERNAL TEMPERATURE
AND GENERATING TEMPERATURE COMPENSATION CODE
CORRESPONDING TO INTERNAL TEMPERATURE — S801

GENERATING CONVERSION TEMPERATURE CODE
CONVERTED FROM TEMPERATURE COMPENSATION CODE — S803

GENERATING COMPENSATION VOLTAGE CODE
BASED ON DEFAULT VOLTAGE CODE
AND CONVERSION TEMPERATURE CODE — S805

OUTPUTTING COMPENSATION VOLTAGE OBTAINED
BY COMPENSATING FOR LEVEL OF PUMP VOLTAGE
BASED ON COMPENSATION VOLTAGE CODE — S807

END

MEMORY DEVICE GENERATING VOLTAGE RESPONSIVE TO TEMPERATURE AND METHOD OF OPERATING THE SAME

CROSS-REFERENCE TO RELATED APPLICATION

The present application claims priority under 35 U.S.C. § 119(a) to Korean patent application number 10-2023-0122538 filed on Sep. 14, 2023, in the Korean Intellectual Property Office, the entire disclosure of which is incorporated by reference herein.

BACKGROUND

1. Technical Field

The present disclosure relates to an electronic device, and more particularly, to a semiconductor memory device, which generate a voltage responsive to a temperature. The disclosure also relates to a method of operating the same.

2. Related Art

A memory system is a device that stores data under control of a host device such as a computer or a smartphone. The memory system may include a memory device in which data is stored and a memory controller controlling the memory device. The memory device is classified into a volatile memory device and a nonvolatile memory device.

The nonvolatile memory device is a device in which data is not lost even though power is cut off. The nonvolatile memory device includes a read only memory (ROM), a programmable ROM (PROM), an electrically programmable ROM (EPROM), an electrically erasable and programmable ROM (EEPROM), a flash memory, and the like.

The nonvolatile memory device may include a plurality of memory cells in which data is stored. A threshold voltage of the plurality of memory cells may increase or decrease according to a voltage applied to a memory cell. A degree to which the threshold voltage of the plurality of memory cells increases or decreases may vary according to a temperature of the nonvolatile memory device. The nonvolatile memory device may thus change a level of the voltage applied to memory cells in response to or as a function of an internal temperature of the memory cells in order to compensate for memory cell threshold voltage changes, i.e., increases or decreases.

SUMMARY

An embodiment of the present disclosure provides a memory device and a method of operating the same, which improve the accuracy of compensating for a voltage level, which may change according to a temperature.

According to an embodiment of the present disclosure, a memory device includes a memory cell array including a plurality of memory cells, a temperature sensor configured to measure an internal temperature and generate a temperature compensation code corresponding to the measured internal temperature, a voltage control circuit configured to generate a conversion temperature code, generated or converted from the generated temperature compensation code, and a voltage generation circuit configured to output a compensation voltage, which is obtained by compensating for a level of a voltage used in an operation on the memory cell array responsive to the conversion temperature code.

The temperature sensor and the voltage control circuit are located at different positions relative to the memory cell array.

According to an embodiment of the present disclosure, a method of operating a memory device includes measuring an internal temperature and generating a temperature compensation code corresponding to the internal temperature, by a temperature sensor positioned on a first surface of a memory cell array, generating a conversion temperature code converted from the temperature compensation code, by a voltage control circuit positioned on a second surface of the memory cell array, outputting a compensation voltage obtained by compensating for a level of a voltage used in an operation on the memory cell array responsive to the conversion temperature code, and performing an operation on the memory cell array using the compensation voltage.

According to an embodiment of the present disclosure, a memory device includes a memory cell array including a plurality of memory cells, a voltage register configured to store a default voltage code indicating a default level of a voltage used in an operation on the memory cell array, a temperature sensor configured to measure an internal temperature and generate a temperature compensation code responsive to the internal temperature, a voltage control circuit configured to generate a conversion temperature code converted from the temperature compensation code, and output a compensation voltage code responsive to the default voltage code and the conversion temperature code, and a voltage generation circuit configured to provide a compensation voltage obtained by compensate for a level of the voltage responsive to the compensation voltage code to the memory cell array. The memory cell array is positioned between the temperature sensor and the voltage control circuit.

According to an embodiment of the present disclosure, a memory device including a memory cell array includes a first peripheral circuit arranged under the memory cell array, the first peripheral circuit configured to generate at least one temperature compensation code by sensing a temperature of the memory cell array and a second peripheral circuit arranged over the memory cell array, the second peripheral circuit configured to compensate a level of at least one voltage to be provided to the memory cell array responsive to the temperature compensation code.

According to the present technology, a memory device and a method of operating the same capable of improving accuracy of compensating for a voltage level according to a temperature are provided.

BRIEF DESCRIPTION OF THE DRAWINGS

FIG. 4 is a diagram illustrating a temperature compensation code generated by a temperature sensor.

FIG. 5 is a diagram illustrating a conversion temperature code according to an embodiment of the present disclosure.

FIG. 6 is a diagram illustrating a conversion temperature code according to another embodiment of the present disclosure.

FIG. 7 is a diagram illustrating a conversion temperature code according to still another embodiment of the present disclosure.

FIG. 8 is a flowchart illustrating an operation of outputting the compensation voltage obtained by compensating for the level of the pump voltage responsive to the internal temperature.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Figure 1:
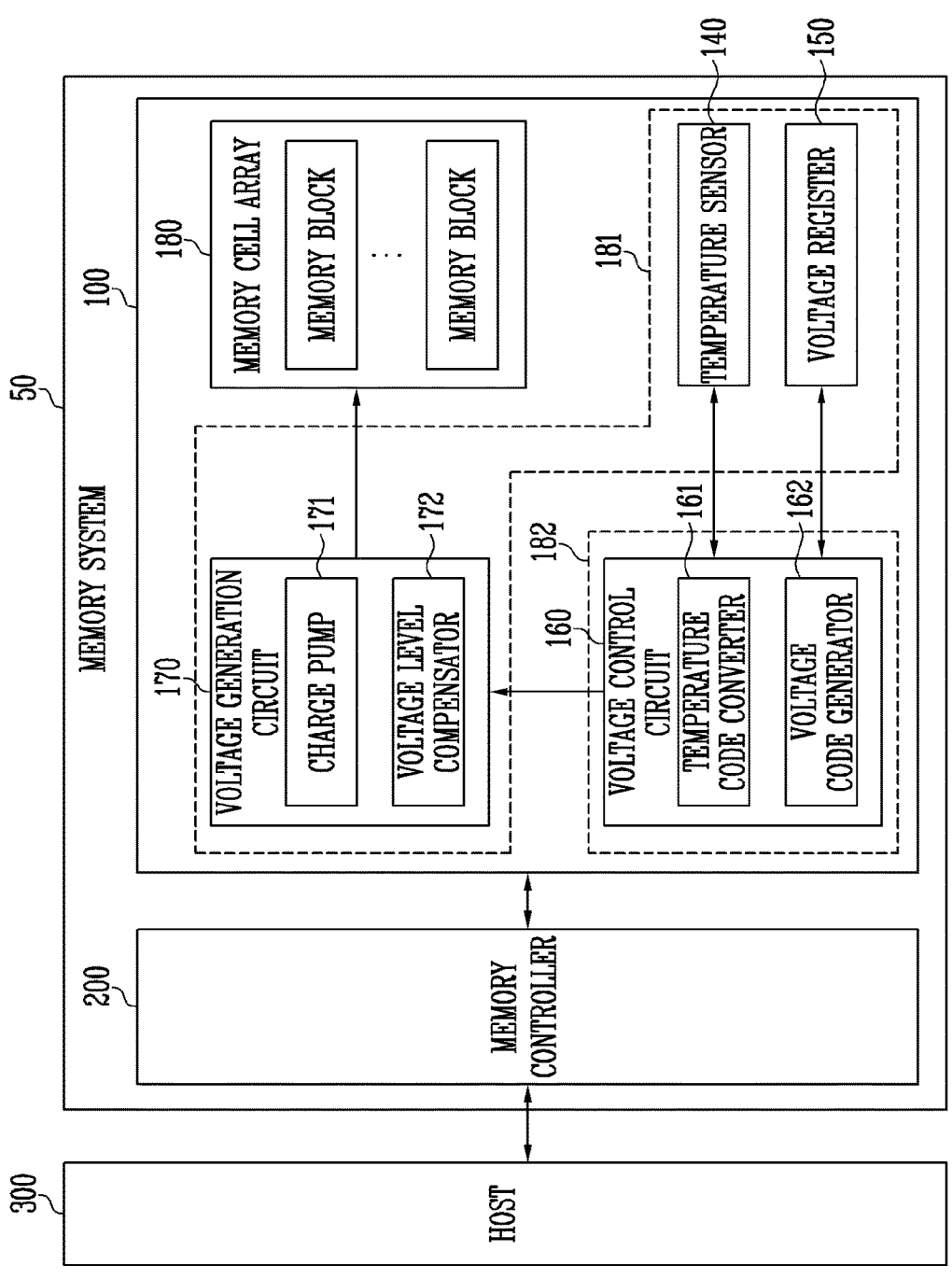
FIG. 1 is a diagram illustrating a memory system including a memory device.

FIG. 1 is a diagram illustrating a memory system including a memory device.

Referring to FIG. 1, the memory system 50 may include the memory device 100 and a memory controller 200. The memory system 50 may be a device that stores data under control of a host 300. The host 300 is usually an external device, i.e., an "external device" being a device that the memory system 50 and its components 100, 200 are not a part of. The memory system 50 may be included in various electronic devices such as a computer, a server, and an automobile as well as a mobile device such as a mobile phone, a tablet PC, and a wearable device.

The memory system 50 may be manufactured as various types of storage devices such as a solid state drive (SSD) and a universal flash storage (UFS) according to a host interface, which is a communication method with the host 300. The memory system 50 may be manufactured as various types of package types such as a system on chip (SOC).

The memory device 100 may store data. The memory device 100 may operate in response to control of the memory controller 200. In an embodiment, the memory device 100 may be a nonvolatile memory device or a volatile memory device.

The memory device 100 may receive a command and an address from the memory controller 200 and may perform an operation instructed by, or corresponding to, the command on a region, is selected by the address. The memory device 100 may perform a program operation (write operation) of storing data in the region selected by the address, a read operation of reading data, or an erase operation of deleting data.

The memory controller 200 may control an overall operation of the memory system 50.

When power is applied to the memory system 50, the memory controller 200 may execute firmware (FW). In an embodiment, the memory controller 200 may execute firmware to control communication between the host 300 and the memory device 100. In an embodiment, the memory controller 200 may convert a logical address of the host into a physical address of the memory device.

The memory controller 200 may control the memory device 100 to perform the program operation, the read operation, the erase operation, or the like according to a request of the host 300. The memory controller 200 may provide the command, the physical address, or data to the memory device 100 according to the program operation, the read operation, or the erase operation.

In an embodiment, the memory controller 200 may generate the command, the address, and data independently regardless of the request from the host 300 and transmit the command, the address, and the data to the memory device 100. For example, the memory controller 200 may provide the command, the address, and the data for performing the program operation, the read operation, and the erase operation required in performing a background operation such as wear leveling, read reclaim, or garbage collection, to the memory device 100.

In an embodiment, the memory controller 200 may control at least two or more memory devices 100. In this case, the memory controller 200 may control the memory devices 100 according to an interleaving method to improve operation performance. The interleaving method may be a method of controlling to overlap internal operations of at least two memory devices 100.

The host 300 may communicate with the memory system 50 using various communication methods.

In an embodiment, the memory device 100 may include a memory cell array 180, a first peripheral circuit 181, and a second peripheral circuit 182. The memory cell array 180 may include a plurality of memory blocks. Each of the plurality of memory blocks may include a plurality of memory cells.

The first peripheral circuit 181 may include a temperature sensor 140, a voltage register 150, and a voltage generation circuit 170. The second peripheral circuit 182 may include a voltage control circuit 160. The temperature sensor 140 may measure an internal temperature of the memory device 100. As used herein, the term, "internal temperature" may refer to a temperature of the memory device 100 at a location physically within and preferably at or near or "proximate" the geometric center of the memory cell array 180. An "internal temperature" may also be a temperature of the memory device 100 at a location at or near the geometric center of the memory device 100.

The temperature sensor 140 may generate a temperature compensation code responsive to the measured internal temperature, measured by the temperature sensor 140. Because heat transfer in the memory device 100 occurs essentially by conduction and not by radiation or convection, in one embodiment the temperature sensor 140 is embodied as a temperature-sensitive semiconductor having a close or tight thermal coupling to the memory cell array 180 but also having a reduced thermal coupling to other devices of the memory system 50. Because all of the memory system 50 components generate heat, which is eventually conducted into all of the components, in an alternate embodiment, the temperature sensor 140, the memory cell array 180 and one or both peripheral circuit 181, 182 are enclosed within a thermal isolation layer or "blanket" formed around all of the components that comprise the memory device 100. In such an embodiment, the temperature sensor 140 and the memory cell array 180 are enclosed within a thermal isolation layer, See FIG. 2.

A thermal isolation layer may be embodied as a dielectric material, which is of course an electrically non-conductive material. Because they are electrically non-conductive, dielectric materials tend to be thermally less conducive than electrically conductive materials. Stated another way, the heat transfer coefficient, Tc of dielectrics tends to be lower than the heat transfer coefficient Tc of conductors as well as semiconductors. Dielectric materials that may provide thermal isolation include but are not limited to aluminum nitride, aluminum oxide, beryllium oxide, boron nitride and silicon carbide.

The voltage register 150 may store a default voltage code indicating a default level of a voltage used in an operation for the memory cell array. The level of the voltage used in the operation on the memory cell array may be determined responsive to the default voltage code.

The voltage control circuit 160 may control the voltage generation circuit 170 to generate the voltage used in the operation on the memory cell array. The operation on the memory cell array may be the program operation, the read operation, or the erase operation.

In an embodiment, the voltage control circuit 160 may include a temperature code converter 161 and a voltage code generator 162. The temperature code converter 161 may generate a conversion temperature code from the temperature compensation code received from the temperature sensor 140. In an embodiment, the temperature code converter 161 may generate the conversion temperature code by performing a shift operation on the temperature compensation code. The shift operation may be an operation that shifts binary data included in the temperature compensation code right or left.

The voltage code generator 162 may generate a compensation voltage code responsive to the default voltage code and the conversion temperature code. The compensation voltage code may be a code obtained by adding the default voltage code and the conversion temperature code.

In an embodiment, the voltage generation circuit 170 may include a charge pump 171 and a voltage level compensator 172.

The charge pump 171 may generate a charged-pumped voltage. The charge pump 171 may be embodied as a charge pump known to those of ordinary skill. The charge pump 171 may perform a pump operation to generate a voltage under control of the voltage control circuit 160.

The voltage level compensator 172 may change a level of the pump-generated voltage according to the compensation voltage code. The voltage level compensator 172 may output a compensation voltage obtained by compensating for the level of the pump voltage responsive to the compensation voltage code. The compensation voltage may be applied to the memory cell array 180. The memory cell array 180 may perform an operation corresponding to a command received from the memory controller 200 using the compensation voltage.

Figure 2:
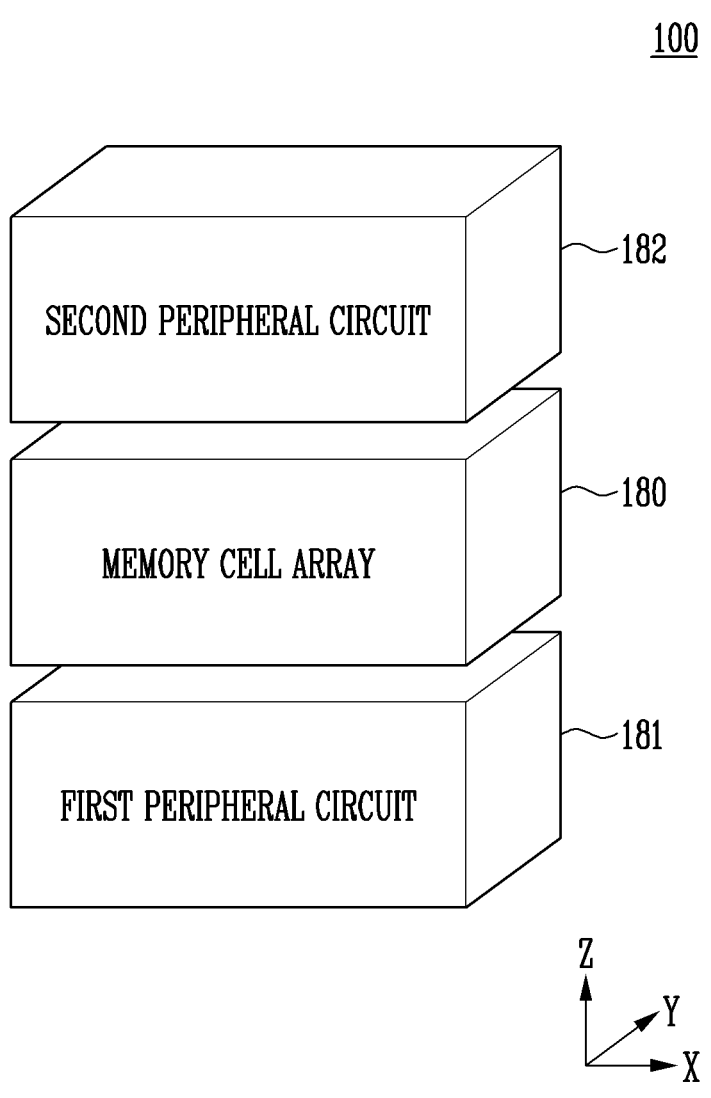
FIG. 2 is a diagram illustrating a disposition of a first peripheral circuit, a second peripheral circuit, and a memory cell array.

FIG. 2 is a diagram illustrating a disposition of the first peripheral circuit, the second peripheral circuit, and the memory cell array.

Referring to FIGS. 1 and 2, the first peripheral circuit 181 may include the temperature sensor 140, the voltage register 150, and the voltage generation circuit 170. The second peripheral circuit 182 may include the voltage control circuit 160.

The first peripheral circuit 181 and the second peripheral circuit 182 may be located at different positions relative to the memory cell array 180. Specifically, the first peripheral circuit 181 may be located under the memory cell array 180. The second peripheral circuit 182 may be located on the memory cell array 180. The memory cell array 180 may be located between the first peripheral circuit 181 and the second peripheral circuit 182.

In various embodiments, the first peripheral circuit 181 may include the temperature sensor 140 and the voltage register 150. For example, the second peripheral circuit 182 may include the voltage control circuit 160 and the voltage generation circuit 170.

Alternately, the first peripheral circuit 181 may include the temperature sensor 140 and the second peripheral circuit 182 may include the voltage generation circuit 170, especially, the voltage level compensator 172 in addition to the voltage register 150 and the voltage control circuit 160.

Figure 3:
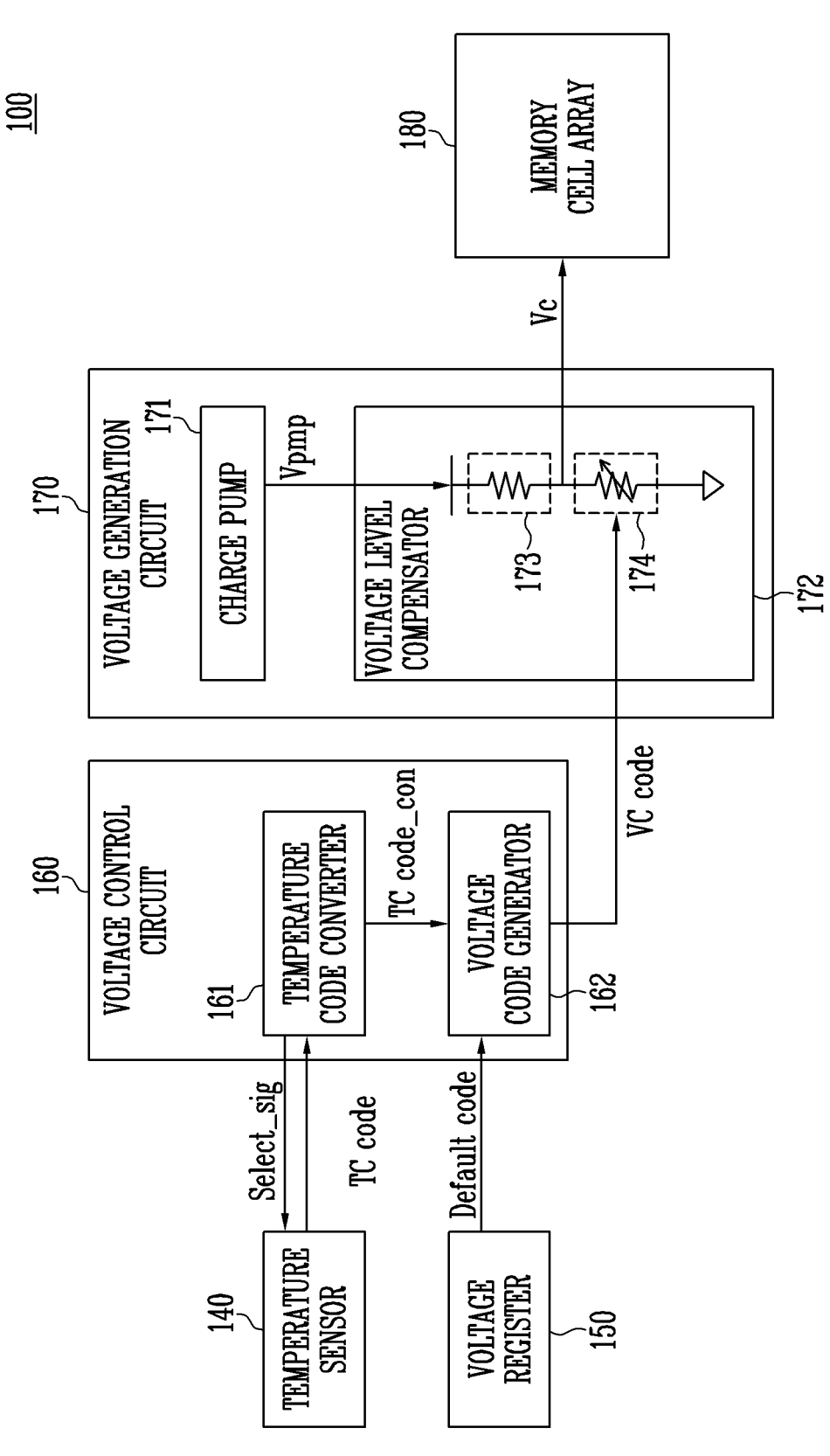
FIG. 3 is a diagram illustrating an operation of outputting a compensation voltage obtained by compensating for a level of a pump voltage responsive to an internal temperature.

FIG. 3 is a diagram illustrating an operation of outputting the compensation voltage obtained by compensating for the level of the pump voltage responsive to the internal temperature.

Referring to FIG. 3, the temperature sensor 140 may measure the internal temperature of the memory device 100. The temperature sensor 140 may then generate a temperature compensation code TC code responsive to or responsive to the internal temperature measured by the temperature sensor 140. The temperature sensor 140 may output a code corresponding to the internal temperature and a correction code select signal Select_sig received from the voltage control circuit 160 as the temperature compensation code TC code. The correction code select signal Select_sig may be a signal for selecting any one of correction code groups.

The voltage control circuit 160 may include the temperature code converter 161 and the voltage code generator 162.

The temperature code converter 161 may receive the temperature compensation code TC code from the temperature sensor 140. The temperature code converter 161 may generate a conversion temperature code TC code_con responsive to a result of performing a shift operation on the temperature compensation code TC code. The shift operation may be an operation that shifts data of 1 included in the temperature compensation code TC code to the right or left. The temperature code converter 161 may provide the conversion temperature code TC code_con obtained by converting the temperature compensation code TC code to the voltage code generator 162.

The voltage register 150 may store a default voltage code Default code indicating the default level of the voltage used in the operation on the memory cell array 180. The default voltage code Default code may be provided to the voltage code generator 162.

The voltage code generator 162 may generate a compensation voltage code VC code responsive to the conversion temperature code TC code_con and the default voltage code Default code. In an embodiment, the voltage code generator 162 may generate a code obtained by adding the conversion temperature code TC code_con and the default voltage code Default code as the compensation voltage code VC code. The voltage code generator 162 may provide the compensation voltage code VC code to the voltage level compensator 172.

The voltage generation circuit 170 may include the charge pump 171 and the voltage level compensator 172.

The charge pump 171 may perform a pump operation of generating a pump voltage Vpmp. The charge pump 171 may provide the pump voltage Vpmp to the voltage level compensator 172.

The voltage level compensator 172 may include a first resistor 173 and a second resistor 174. The second resistor 174 may be a variable resistor. The voltage level compensator 172 may output a compensation voltage Vc obtained by compensating a level of the pump voltage Vpmp according to the compensation voltage code VC code. Specifically, the resistance of the second resistor 174 may change according to the compensation voltage code VC code. When the resistance of the second resistor 174 changes, the level of the pump voltage Vpmp may change according to a ratio of the resistance of the first resistor 173 and the second resistor 174, and the pump voltage of the changed level may be output as the compensation voltage Vc. The compensation voltage Vc may be provided to the memory cell array 180. The compensation voltage Vc may be applied to the plurality of word lines, the bit lines, or the source line included in the memory cell array 180. In an embodiment, the compensation voltage Vc may be the program voltage or the program pass voltage used in the program operation. In an embodiment, the compensation voltage Vc may be the read voltage or the read pass voltage used in the read operation. In an embodiment, the compensation voltage Vc may be the erase voltage used in the erase operation.

For example, the second resistor 174 may include at least metal line. A resistance of the second resistor 174 may be varied through a revision (or adjustment) of an effective length of the metal line responsive to the compensation voltage code VC code (or temperature compensation code TC code). In an embodiment, the "revision" or "metal revision" refers to changing (or adjusting) the resistance of the metal line by changing the length of shape of the metal line. For convenience of the revision of the metal line, the voltage level compensator 172 with the second resistor 174 may be formed over the memory cell array 180.

A level of the compensation voltage may change according to the temperature compensation code TC code output by the temperature sensor 140. In order to perform an operation on the memory cell array 180 using a compensation voltage Vc having an optimal level according to the internal temperature of the memory device 100, correction of the temperature compensation code TC code may be required.

Meanwhile, as described with reference to FIGS. 1 and 2, since the temperature sensor 140 is included in the first peripheral circuit 181 and the voltage control circuit 160 is included in the second peripheral circuit 182, the temperature sensor 140 may be located to maximize heat transfer into the sensor 140 and one such location may be under the memory cell array 180. The voltage control circuit 160 may be located on the memory cell array 180.

The temperature code converter 161 positioned on the memory cell array 180 may correct the temperature compensation code TC code to the conversion temperature code TC code_con and adjust a level of the compensation voltage Vc according to the conversion temperature code TC code_con. Therefore, the operation on the memory cell array 180 may be performed with the compensation voltage Vc having an optimal level according to the internal temperature of the memory device 100.

FIG. 4 is a diagram illustrating the temperature compensation code generated by the temperature sensor.

Referring to FIG. 4, the temperature sensor 140 may measure the internal temperature of the memory device. The temperature sensor 140 may generate the temperature compensation code responsive to the internal temperature and the correction code select signal received from the temperature code converter 161. The temperature sensor 140 may provide the temperature compensation code to the temperature code converter 161. The correction code select signal may be a signal for selecting any one of correction code groups TC group1 to TC group3.

In an embodiment, when the internal temperature is 96° C., a temperature code Temp code corresponding to 96° C. may be 3. The temperature sensor 140 may generate a temperature code indicating 3 corresponding to 96° C. which is the internal temperature. In addition, when the temperature sensor 140 receives the correction code select signal for selecting a first correction code group TC group1, the temperature sensor 140 may generate a temperature compensation code in which the temperature code 3 is corrected to 5. That is, the temperature sensor 140 may generate a temperature compensation code indicating 5 corresponding to 96° C. which is the internal temperature and corresponding to the correction code select signal for selecting the first correction code group.

In an embodiment, the temperature sensor 140 may generate a temperature compensation code indicating 4 when the internal temperature is 96° C. and a correction code select signal for selecting a third correction code group TC group3 is received.

In an embodiment, when the internal temperature is 80° C., a temperature code corresponding to 80° C. may be 6. The temperature sensor 140 may generate a temperature code indicating 6 corresponding to 80° C. which is the internal temperature. In addition, when the temperature sensor 140 receives a correction code select signal for selecting a second correction code group TC group2, the temperature sensor 140 may generate a temperature compensation code in which the temperature code 6 is corrected to 7. That is, the temperature sensor 140 may generate a temperature compensation code indicating 7 corresponding to 80° C. which is the internal temperature and corresponding to the correction code select signal for selecting the third correction code group.

Figure 5:
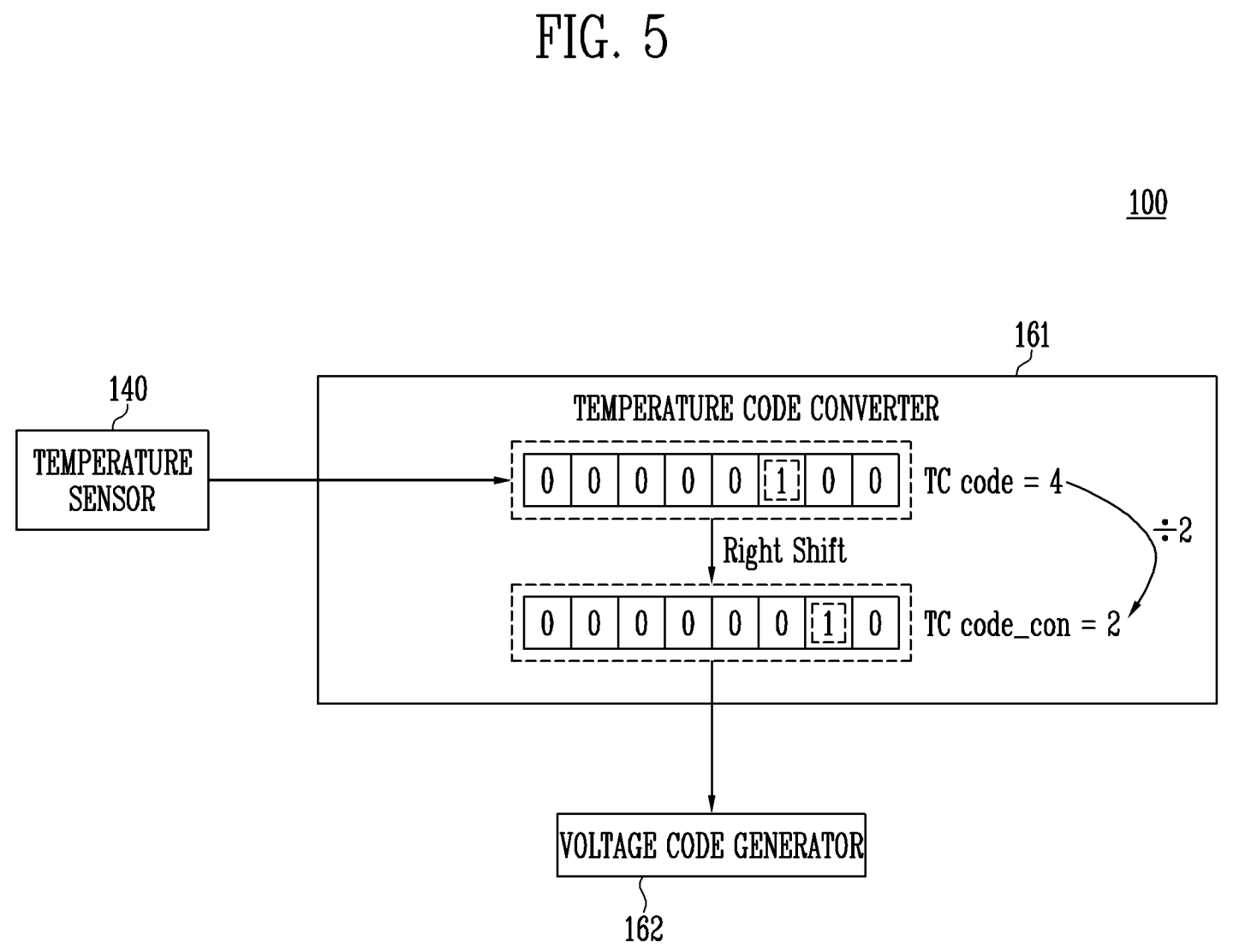

FIG. 5 is a diagram illustrating a conversion temperature code according to an embodiment of the present disclosure.

Referring to FIG. 5, the temperature sensor 140 may measure the internal temperature of the memory device 100 and provide the temperature compensation code TC code corresponding to the internal temperature to the temperature code converter 161. The temperature code converter 161 may generate the conversion temperature code TC code_con responsive to the result of performing the shift operation on the temperature compensation code. The temperature code converter 161 may provide the conversion temperature code TC code_con to the voltage code generator 162.

In an embodiment, the temperature code converter 161 may receive a temperature compensation code indicating 4 from the temperature sensor 140. When the temperature compensation code is configured of 8 bits, the temperature compensation code indicating 4 may be 00000100. The temperature code converter 161 may perform a shift operation of shifting data of 1 included in the temperature compensation code to the right. The temperature code converter 161 may generate a conversion temperature code corresponding to 00000010 by performing a shift operation on the temperature compensation code corresponding to 00000100. The temperature code converter 161 may generate a conversion temperature code indicating 2 by performing a shift operation on the temperature compensation code indicating 4. That is, performing the shift operation on the temperature compensation code may be performing a division operation on the temperature compensation code.

Thereafter, the temperature code converter 161 may provide the conversion temperature code indicating 2 to the voltage code generator 162. The voltage code generator 162 may generate the compensation voltage code responsive to the conversion temperature code.

Figure 6:
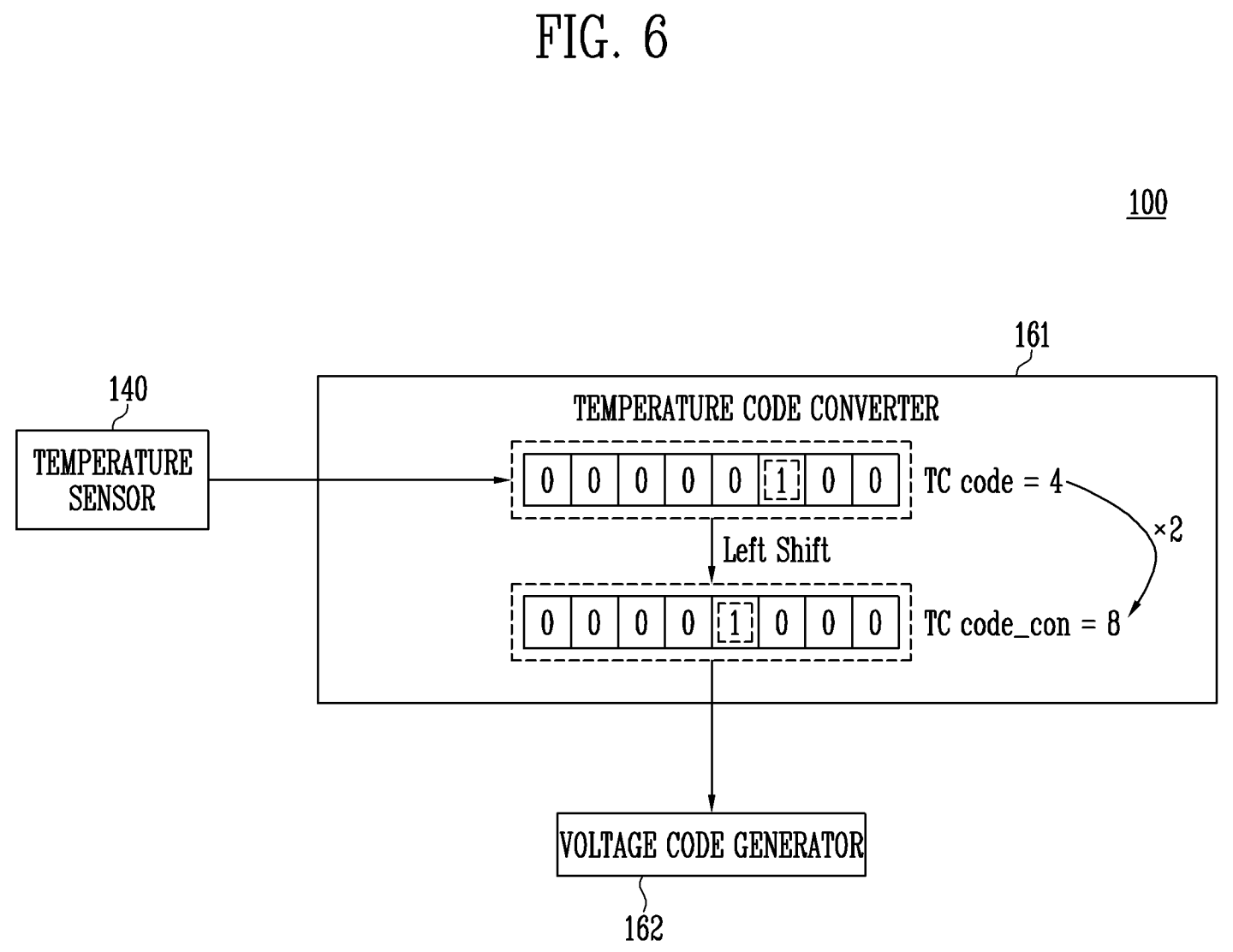

FIG. 6 is a diagram illustrating a conversion temperature code according to another embodiment of the present disclosure.

Referring to FIG. 6, the temperature code converter 161 may receive a temperature compensation code indicating 4 from the temperature sensor 140. When the temperature compensation code is configured of 8 bits, the temperature compensation code indicating 4 may be 00000100. The temperature code converter 161 may perform a shift operation of shifting data of 1 included in the temperature compensation code to the left. The temperature code converter 161 may generate a conversion temperature code corresponding to 00001000 by performing the shift operation on the temperature compensation code corresponding to 00000100. The temperature code converter 161 may generate a conversion temperature code indicating 8 by performing the shift operation on the temperature compensation code indicating 4. That is, performing the shift operation on the temperature compensation code may be performing a multiplication operation on the temperature compensation code.

Thereafter, the temperature code converter 161 may provide the conversion temperature code indicating 8 to the voltage code generator 162. The voltage code generator 162 may generate the compensation voltage code responsive to the conversion temperature code.

Figure 7:
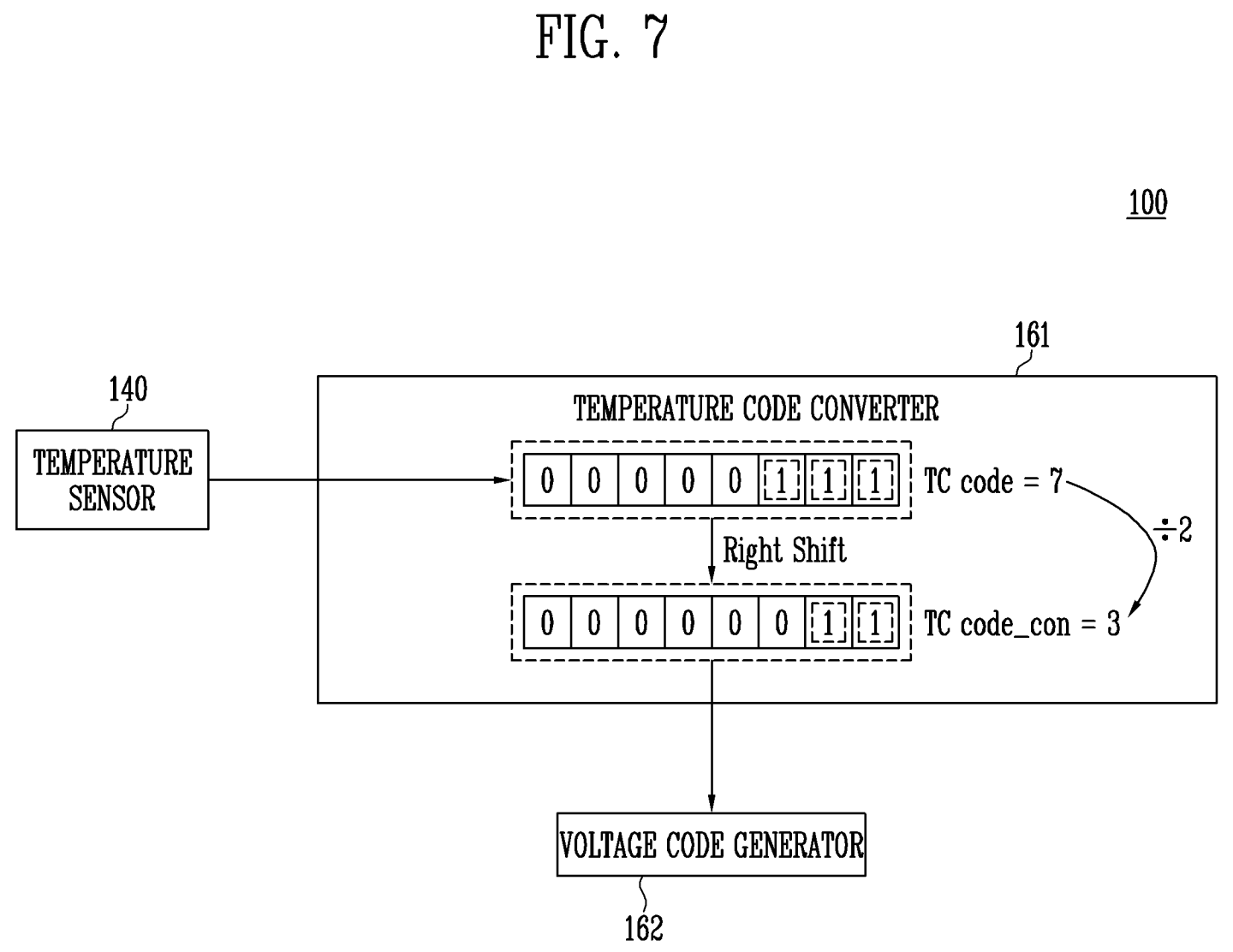

FIG. 7 is a diagram illustrating a conversion temperature code according to still another embodiment of the present disclosure.

Referring to FIG. 7, the temperature code converter 161 may receive a temperature compensation code indicating 7 from the temperature sensor 140. When the temperature compensation code is configured of 8 bits, the temperature compensation code indicating 7 may be 00000111. The temperature code converter 161 may perform a shift operation of shifting data of 1 included in the temperature compensation code to the right. The temperature code converter 161 may generate a conversion temperature code corresponding to 00000011 by performing the shift operation on the temperature compensation code corresponding to 00000111. The temperature code converter 161 may generate a conversion temperature code indicating 3 by performing the shift operation on the temperature compensation code indicating 7. That is, performing the shift operation on the temperature compensation code may be performing a division operation on the temperature compensation code. When the temperature compensation code is data corresponding to an odd number, the conversion temperature code may be data indicating only a quotient as a result of division for the temperature compensation code.

Thereafter, the temperature code converter 161 may provide the conversion temperature code indicating 3 to the voltage code generator 162. The voltage code generator 162 may generate the compensation voltage code responsive to the conversion temperature code.

FIG. 8 is a flowchart illustrating an operation of outputting the compensation voltage obtained by compensating for the level of the pump voltage responsive to the internal temperature.

Referring to FIG. 8, in step S801, the memory device 100 may measure the internal temperature and generate the temperature compensation code corresponding to the internal temperature.

In step S803, the memory device 100 may generate the conversion temperature code converted from the temperature compensation code. The conversion temperature code may be data indicating the result of performing the shift operation on the temperature compensation code. The shift operation may be an operation of shifting data of 1 included in the temperature compensation code to the right or left.

In step S805, the memory device 100 may generate the compensation voltage code responsive to the default voltage code and the conversion temperature code. The default voltage code may be data indicating the default level of the voltage used in the operation on the memory cell array. The compensation voltage code may be the code obtained by adding the default voltage code and the conversion temperature code.

In step S807, the memory device 100 may output the compensation voltage obtained by compensating for the level of the pump voltage responsive to the compensation voltage code. The memory device 100 may perform the operation corresponding to the command received from the memory controller using the compensation voltage.

Figure 9:
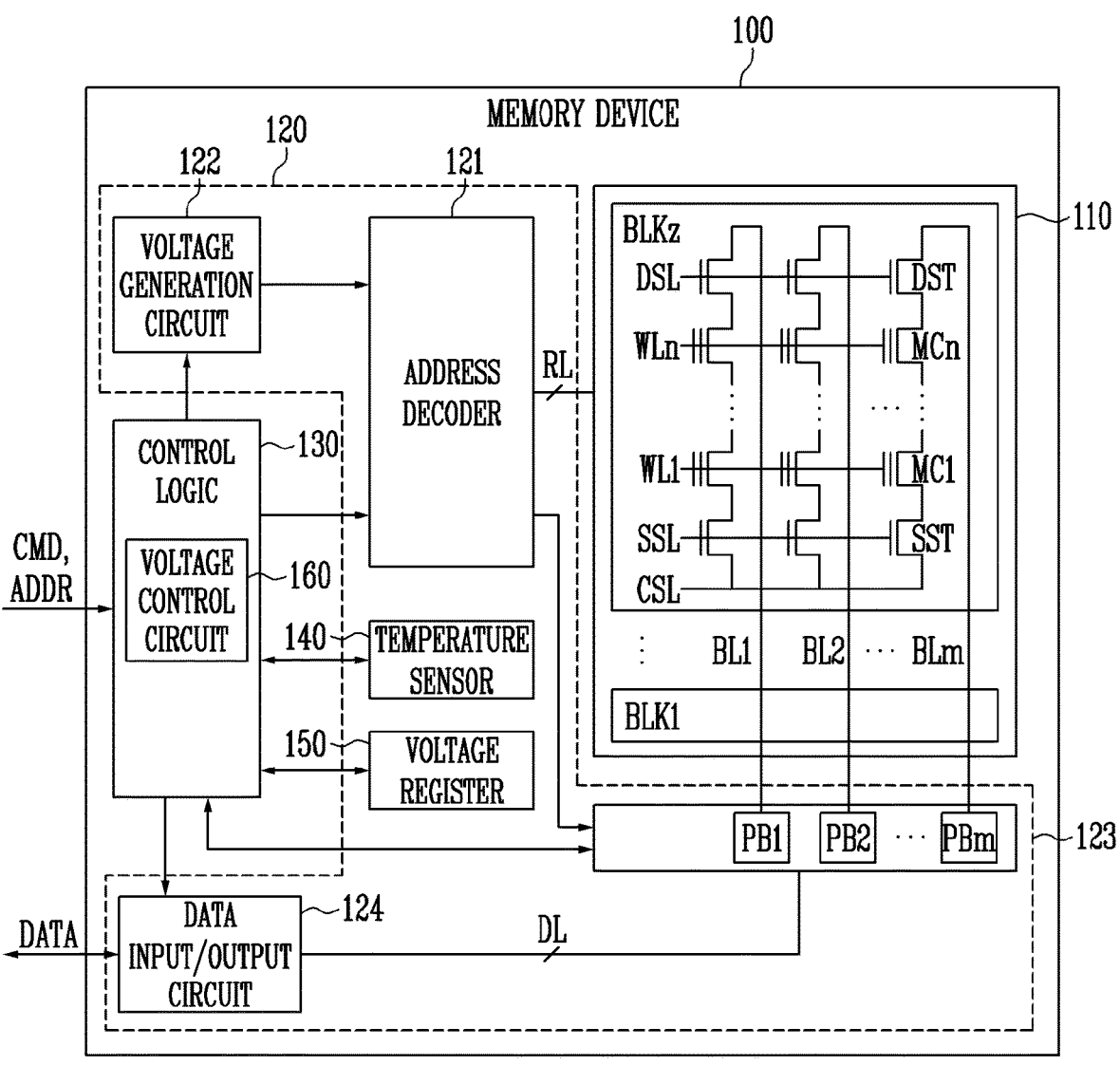
FIG. 9 is a diagram illustrating a structure of the memory device.

FIG. 9 is a diagram illustrating a structure of the memory device.

Referring to FIG. 9, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be connected to an address decoder 121 through row lines RL. The plurality of memory blocks BLK1 to BLKz may be connected to a page buffer group 123 through bit lines BL1 to BLm. Each of the plurality of memory blocks BLK1 to BLKz may include a plurality of memory cells. In an embodiment, the plurality of memory cells may be nonvolatile memory cells.

Each of the plurality of memory cells may be configured of a single level cell (SLC) storing one bit of data, a multi-level cell (MLC) storing two bits of data, a triple level cell (TLC) storing three bits of data, a quad level cell (QLC) capable of storing four bits of data, or memory cells capable of storing five or more bits of data.

In an embodiment, any one memory block BLKz among the plurality of memory blocks BLK1 to BLKz may include a plurality of word lines WL1 to WLn arranged in parallel between a drain select line DSL and a source select line SSL. The memory block BLKz may include a plurality of memory cell strings connected between any one bit line and a common source line CSL. Each of the bit lines BL1 to BLm may be connected to the plurality of memory cell strings, and the plurality of memory cell springs may be commonly connected to the common source line CSL.

For example, the memory cell string may include a drain select transistor DST, a plurality of memory cells MC1 to MCn, and a source select transistor SST connected in series between the common source line CSL and a first bit line BL1. One memory cell string may include at least one drain select transistor DST and at least one source select transistors SST.

A drain of the drain select transistor DST may be connected to the first bit line BL1, and a source of the source select transistor SST may be connected to the common source line CSL. The plurality of memory cells MC1 to MCn may be connected in series between the drain select transistor DST and the source select transistor SST. Gates of the source select transistors SST included in different memory cell strings may be connected to the source select line SSL, gates of the drain select transistors DST may be connected to the drain select line DSL, and gates of the memory cells MC1 to MCn may be connected to the word lines WL1 to WLn.

The peripheral circuit 120 may drive the memory cell array 110. For example, the peripheral circuit 120 may drive the memory cell array 110 to perform the program operation, the read operation, and the erase operation under control of the control logic 130. As another example, the peripheral circuit 120 may apply various operation voltages to the row lines RL and the bit lines BL1 to BLm or discharge the applied voltages according to the control of the control logic 130.

The peripheral circuit 120 may include the address decoder 121, a voltage generation circuit 122, a page buffer group 123, a data input/output circuit 124, a temperature sensor 140, and a voltage register 150. The peripheral circuit 120 shown in FIG. 9 may be a configuration that further includes the address decoder 121, the data input/output circuit 124, and the page buffer group 123 in the first peripheral circuit 181 shown in FIG. 1. In an embodiment, the peripheral circuit 120 may be positioned under the memory cell array 110.

The address decoder 121 may be connected to the memory cell array 110 through the row lines RL. The row lines RL may include drain select lines, dummy word lines, a plurality of word lines, and source select lines.

The address decoder 121 may be configured to operate in response to the control of the control logic 130. The address decoder 121 may receive an address from the control logic 130.

The address decoder 121 may be configured to decode a row address of the received address. The address decoder 121 may select at least one word line of a selected memory block by applying voltages provided from the voltage generation circuit 122 to at least one word line according to the row address.

The address decoder 121 may be configured to decode a column address of the address. The column address may be transferred to the page buffer group 123.

During the program operation, the address decoder 121 may apply a program voltage to a selected word line and apply a pass voltage of a level lower than that of the program voltage to unselected word lines. During a program verify operation, the address decoder 121 may apply a verify voltage to the selected word line and apply a verify pass voltage of a level higher than that of the verify voltage to the unselected word lines.

During the read operation, the address decoder 121 may apply a read voltage to the selected word line and apply a read pass voltage of a level higher than that of the read voltage to the unselected word lines.

The voltage generation circuit 122 may generate a plurality of operation voltages using an external power voltage supplied to the memory device 100. The voltage generation circuit 122 may operate in response to the control of the control logic 130. In an embodiment, the voltage generation circuit 122 may include the voltage generation circuit 170 of FIG. 1. The voltage generation circuit 122 may generate the compensation voltage obtained by compensating for the level of the pump voltage generated by the charge pump according to the compensation voltage code.

In an embodiment, the voltage generation circuit 122 may generate various operation voltages used for the program, read, and erase operations. For example, the voltage generation circuit 122 may generate a plurality of erase voltages, a plurality of program voltages, a plurality of pass voltages, a plurality of select read voltages, and a plurality of unselect read voltages. The operation voltages may be supplied to the memory cell array 110 by the address decoder 121.

The page buffer group 123 may include first to m-th page buffers PB1 to PBm. The first to m-th page buffers PB1 to PBm may be connected to the memory cell array 110 through first to m-th bit lines BL1 to BLm, respectively. The first to m-th page buffers PB1 to PBm may operate in response to the control of the control logic 130.

The first to m-th page buffers PB1 to PBm may communicate data with the data input/output circuit 124. At a time of program, the first to m-th page buffers PB1 to PBm may receive data DATA through the data input/output circuit 124 and data lines DL.

During the program operation, the first to m-th page buffers PB1 to PBm may transfer the data received through the data input/output circuit 124 to the selected memory cells through the bit lines BL1 to BLm. The memory cells of the selected page may be programmed according to the transferred data. A memory cell connected to a bit line to which a program allowable voltage (for example, a ground voltage) is applied may have an increased threshold voltage. A threshold voltage of a memory cell connected to a bit line to which a program inhibit voltage (for example, a power voltage) is applied may be maintained. During a verify operation, the first to m-th page buffers PB1 to PBm may read the data stored in the memory cells from the selected memory cells through the bit lines BL1 to BLm.

During the read operation, the page buffer group 123 may sense the data from the memory cells of the selected word line through the bit lines BL1 to BLm, and store the sensed data to the first to m-th page buffers PB1 to PBm.

The data input/output circuit 124 may be connected to the first to m-th page buffers PB1 to PBm through the data lines DL. The data input/output circuit 124 may operate in response to the control of the control logic 130. During the program operation, the data input/output circuit 124 may receive data to be stored from the memory controller 200. During the read operation, the data input/output circuit 124 may output the data sensed in the first to m-th page buffers PB1 to PBm to the memory controller 200.

The temperature sensor 140 may measure the internal temperature of the memory device 100. The temperature sensor 140 may generate the temperature compensation code corresponding to the internal temperature. The temperature sensor 140 may provide the temperature compensation code to the control logic 130.

The voltage register 150 may store the default voltage code indicating the default level of the voltage used in the program operation, the read operation, or the erase operation. The default voltage code may be provided to the control logic.

The control logic 130 may be connected to the address decoder 121, the voltage generation circuit 122, the page buffer group 123, the data input/output circuit 124, the temperature sensor 140, and the voltage register 150. The control logic 130 may be configured to control an overall operation of the memory device 100. The control logic 130 may operate in response to the command CMD transferred from the memory controller 200.

The control logic 130 may generate various signals in response to the command CMD and the address ADDR to control the peripheral circuit 120. In an embodiment, the control logic 130 may include the voltage control circuit 160. The voltage control circuit 160 of FIG. 9 may be implemented identically to the voltage control circuit 160 of FIG. 1. In an embodiment, the control logic 130 may be positioned on the memory cell array 110.

In an embodiment, the voltage control circuit 160 may generate the conversion temperature code responsive to a result of performing the shift operation on the temperature compensation code received from the temperature sensor. The voltage control circuit 160 may generate the compensation voltage code responsive to the conversion temperature code and the default voltage code. The voltage control circuit 160 may provide the compensation voltage code to the voltage generation circuit 122.

What is claimed is:

1. A memory device comprising:
a memory cell array including a plurality of memory cells;
a temperature sensor configured to measure an internal temperature of at least one of: the memory cell array and the memory device, the temperature sensor being additionally configured to generate a temperature compensation code corresponding to the internal temperature;
a voltage control circuit configured to generate a conversion temperature code converted from the temperature compensation code; and
a voltage generation circuit configured to output a compensation voltage obtained by compensating for a level of a voltage used in an operation on the memory cell array, responsive to the conversion temperature code,
wherein the temperature sensor and the voltage control circuit are located at different positions relative to the memory cell array location.

2. The memory device of claim 1, further comprising:
a voltage register configured to store a default voltage code indicating a default level of the voltage.

3. The memory device of claim 2, wherein the voltage control circuit comprises a temperature code converter configured to generate the conversion temperature code by performing a shift operation on the temperature compensation code.

4. The memory device of claim 3, wherein the voltage control circuit comprises a voltage code generator configured to generate a compensation voltage code to compensate for the level of the voltage responsive to the default voltage code and the conversion temperature code.

5. The memory device of claim 4, wherein the voltage generation circuit comprises a charge pump configured to perform a pump operation of generate the voltage.

6. The memory device of claim 5, wherein the voltage generation circuit comprises a voltage level compensator configured to change the level of the voltage output from the charge pump to a level of the compensation voltage according to the compensation voltage code.

7. The memory device of claim 1, wherein the temperature sensor is located under the memory cell array, and
the voltage control circuit is located on the memory cell array.

8. The memory device of claim 1, wherein the temperature sensor outputs the temperature compensation code corresponding to the internal temperature and a correction code select signal received from the voltage control circuit.

9. The memory device of claim 1, wherein the temperature sensor is located substantially at the geometric center of at least one of: the memory cell array and the memory device.

10. The memory device of claim 1, wherein the temperature sensor is located within a thermal isolation layer.

11. The memory device of claim 10, wherein the thermal isolation layer comprises at least one of: aluminum nitride, aluminum oxide, beryllium oxide, boron nitride and silicon carbide.

12. A method of operating a memory device, the method comprising:
measuring an internal temperature by a temperature sensor positioned on a first surface of a memory cell array, and generating a temperature compensation code corresponding to the measured internal temperature;
generating a conversion temperature code converted from the temperature compensation code, by a voltage control circuit positioned on a second surface of the memory cell array;
outputting a compensation voltage obtained by compensating for a level of a voltage used in an operation on the memory cell array responsive to the conversion temperature code; and
performing an operation on the memory cell array using the compensation voltage.

13. The method of claim 12, wherein generating the conversion temperature code comprises generating the conversion temperature code by performing a shift operation on the temperature compensation code.

14. The method of claim 12, wherein generating the conversion temperature code comprises generating a compensation voltage code responsive to a default voltage code indicating a default level of the voltage and the conversion temperature code.

15. The method of claim 14, wherein outputting the compensation voltage comprises changing the level of the voltage generated by a charge pump to a level of the compensation voltage according to the compensation voltage code.

16. The method of claim 12, wherein the first surface is a lower portion of the memory cell array, and
the second surface is an upper portion of the memory cell array.

17. A memory device comprising:
a memory cell array including a plurality of memory cells;
a voltage register configured to store a default voltage code indicating a default level of a voltage used in an operation on the memory cell array;
a temperature sensor configured to measure an internal temperature and generate a temperature compensation code responsive to the internal temperature;
a voltage control circuit configured to generate a conversion temperature code converted from the temperature compensation code, and output a compensation voltage code responsive to the default voltage code and the conversion temperature code; and
a voltage generation circuit configured to provide a compensation voltage obtained by compensate for a level of the voltage responsive to the compensation voltage code to the memory cell array,
wherein the memory cell array is positioned between the temperature sensor and the voltage control circuit.

18. The memory device of claim 17, wherein the voltage control circuit comprises a temperature code converter configured to generate the conversion temperature code by performing a shift operation on the temperature compensation code.

19. The memory device of claim 17, wherein the voltage generation circuit comprises:
a charge pump configured to generate the voltage; and
a voltage level compensator configured to change the level of the voltage to the level of the compensation voltage according to the compensation voltage code.

20. The memory device of claim 17, wherein the temperature sensor is located under the memory cell array, and
the voltage control circuit is located on the memory cell array.

* * * * *